May 15, 1962 C. C. RAYBURN ET AL 3,034,198

ELECTRONIC ASSEMBLY

Filed Sept. 24, 1957

INVENTORS
Charles C. Rayburn
Forrest T. Mullikin
BY
George W. Price
ATTY

United States Patent Office 3,034,198
Patented May 15, 1962

3,034,198
ELECTRONIC ASSEMBLY
Charles C. Rayburn and Forrest T. Mullikin, Falls Church, Va., assignors, by mesne assignments, to Illinois Tool Works, Inc., a corporation of Delaware
Filed Sept. 24, 1957, Ser. No. 685,890
4 Claims. (Cl. 29—25.42)

This invention relates to electronic assemblies and more particularly to modular electronic assemblies of the type shown and described in Patent No. 2,774,014 to R. L. Henry, Jr.

In the manufacture of modular electronic assemblies, standardized electronic components are mounted on ceramic wafers adapted to be secured in spaced parallel relationship along riser wires, the wafers having printed conductors thereon leading from their respective components to their related riser wires.

By employing new methods and apparatus for making and assembling the various parts, it is possible to reduce the cost of modular electronic assemblies. It is, therefore, a general object of the invention to provide new methods adapted to facilitate assembling operations and to thereby reduce the cost of manufacture of modular electronic assemblies.

Another object of the invention resides in the provision of new methods for mounting electronic components on ceramic wafers and for forming electrical connections between the components and electric conductors printed on the wafers.

A further object of the invention resides in the provision of methods and means for securing wound capacitors on ceramic wafers prior to forming the electrical connections between the capacitor and the printed conductors on the wafers.

Another object of the invention resides in the provision of methods and means for securing wound capacitors on ceramic wafers and for simultaneously therewith connecting the capacitor electrode foils to the printed conductors on the wafers.

Another object of the invention resides in the provision of a method wherein a wafer and capacitor assembly is dipped into a bath of molten solder to form electrical connections between the capacitor and printed conductors on the wafer and, at the same time, to apply solder to riser notches formed in the edges of the wafers.

Another object of the invention resides in the provision of a wound capacitor comprising aluminum foil electrodes having spiral edge portions coated with copper prior to forming the electrical connections between the electrodes and the printed conductors on the ceramic wafer, the electrode foils being separated by a thermoplastic dielectric, such as polyethylene terephthalate, which also forms the outer cover for the capacitor.

Another object of the invention resides in the provision of a method wherein the capacitor is securely positioned on a wafer by the application of heat to the wafer to cause the dielectric material on the capacitor to adhere to the wafer.

The invention embodies other novel features, details of construction and arrangement of parts which are hereinafter set forth in the specification and claims and illustrated in the accompanying drawing, wherein:

Figure 1:
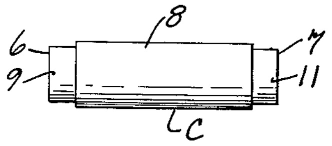
FIG. 1 is a side elevation illustrating a conventional wound capacitor.

Referring now to the drawings for a better understanding of the invention, FIG. 1 illustrates a conventional wound capacitor comprising tin foil electrodes 6 and 7 convolutely wound with and separated by dielectric tapes 8, the inner side edge portions of the electrode foils being in overlapping relationship, and the outer side edge portions of the electrode foils extending outwardly beyond the side edges of the dielectric tapes, as indicated at 9 and 11.

In the winding of the capacitor, it is contemplated that the dielectric tapes will be wound for several turns following the termination of the foils, and that the outer end of the outer dielectric tape will then be heat-sealed to its underlying convolution by a heated iron.

The tapes 8 are formed of polyethylene terephthalate and made in accordance with Patent No. 2,465,319 issued to John Rex Whinfield et al., the tape now being sold under the trademark "Mylar," by E. I. du Pont de Nemours and Company.

Figure 2:
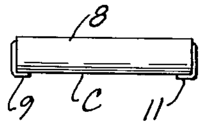
FIG. 2 is a side elevation showing the capacitor of FIG. 1 in flattened form, and also showing the projecting side edge portions of the electrode foils folded back toward each other and along one flattened side of the capacitor.
Figure 3:
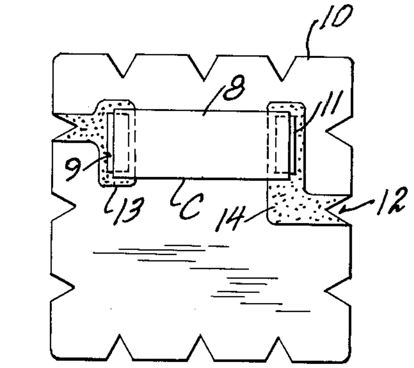
FIG. 3 is a plan view showing the capacitor assembled on a ceramic wafer.
Figure 4:
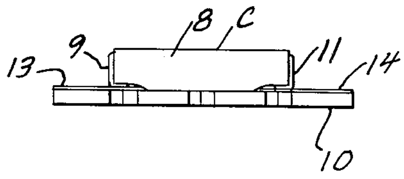
FIG. 4 is a side elevation of same.

After the capacitor has been wound in the manner shown and described, it is flattened by the application of pressure against opposite sides thereof. The edge portions 9 and 11 of the electrode foils are then folded back against one of the flattened sides of the capacitor, as illustrated in FIG. 2; after which, it is mounted on a wafer 10 formed of steatite.

The ceramic wafer 10 is formed with notches 12 along its side edges to receive riser wires (not shown), the walls defining the notches being coated with an electric conductive material which is applied in the form of a paint and preferably contains silver and a ceramic flux, such as glass. The same electric conductive material is also applied to one or both faces of the wafer to form conductors 13 and 14 for connecting the electrode foils to their respective riser wires. After applying the paint, the wafer is fired at a sufficiently high temperature to cause great adherence of the silver thereto, as the glass acts to join the silver to the steatite.

During assembly of the capacitor on the wafer, the wafer is first heated to a temperature of approximately from 600° F. to 800° F. by means of a flame. The capacitor is then mounted on the heated wafer with the edge portions of the electrode foils engaging their respective printed conductors 13 and 14, thereby fusing the edge portions to their conductors and also fusing the dielectric tape to the steatite. Upon cooling of the assembly, the capacitor is rigidly bonded to the wafer and a good electrical connection is provided between the end portions 9 and 11 and their respective printed conductors.

Figure 5:
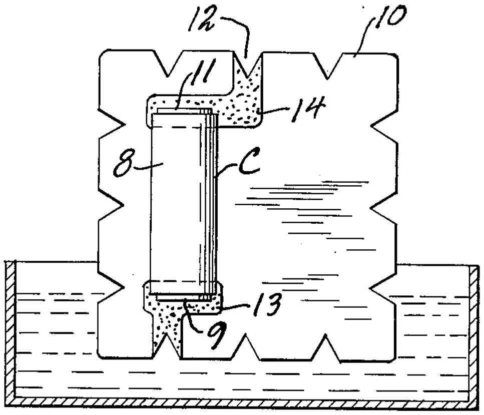
FIG. 5 illustrates a modified form of the invention.

As a modified form of the invention, the ceramic wafer 10 may be heated over a flame to a temperature of approximately 700° F. A capacitor of conventional form, as shown in FIG. 1, is then engaged against the heated wafer to fuse the dielectric tape 8 to the steatite, the tape being of the type heretofore described. The assembly is then dipped into a bath of molten solder, as illustrated in FIG. 5, to apply solder to the walls of the notches 12 and, at the same time, form solder connections between the outer ends of the electrode foils 9 and 11 and their respective printed conductors 13 and 14.

In the modified form of the invention thus described, it is contemplated that the electrode foils 6 and 7 may be formed of either tin or aluminum. However, if made of aluminum, the projecting spiral edge portions 9 and 11 of the electrode foils 6 and 7 are coated with copper prior to being dipped into the bath of molten solder.

While the invention has been shown and described in several forms, it is obvious to those skilled in the art that it is not so limited, but is susceptible of various changes and modifications without departing from the spirit of the invention or the scope of the appended claims.

We claim:

1. The method of making an electronic assembly comprising the steps of taking a convolutely wound capacitor having at least two electrode foils and polyethylene terepthalate dielectric tape and in generally cylindrical form wherein at least one different electrode foil projects beyond the dielectric tape at each end of the cylinder and extra layers of dielectric tape are wound on the outside of cylinder, comprising deforming the cylinder to provide at least one substantially flat peripheral surface on the cylinder substantially parallel with the axis thereof, moving at least a portion of each of the projecting electrode foils to underlying position on said one flattened surface, disposing the said one flattened surface of the cylinder on a ceramic wafer having spaced conductive paths thereon with each of the said underlying portions of the electrode foils in engagement with different ones of said conductive paths, heating at least the mating areas of said one flattened surface and said wafer to cause at least a portion of said extra turns of dielectric tape to soften sufficiently for adhesion to said mating surface of said wafer, and cooling the assembly to provide a firmly bonded stable assembly.

2. The method of making an electronic assembly comprising the steps of convolutely winding at least two electrode foils and polyethylene terepthalate dielectric tape in generally cylindrical form wherein at least one different electrode foil projects beyond the dielectric tape at each end of the cylinder and extra layers of dielectric tape are wound on the outside of cylinder, deforming the cylinder to provide at least one substantially flat peripheral surface on the cylinder substantially parallel with the axis thereof, moving at least a portion of each of the projecting electrode foils to underlying position on said one flattened surface and in intimate engagement therewith, heating a ceramic wafer having spaced conductive paths thereon to a temperature of approximately 600° F. to 800° F., disposing the said one flattened surface of the cylinder on said heated wafer with each of the said underlying portions of the electrode foils in engagement with different ones of said conductive paths to cause at least a portion of said extra turns of dielectric tape to soften sufficiently for adhesion to the mating surface of said wafer, and cooling the assembly to provide a firmly bonded stable assembly.

3. The method of making an electronic assembly comprising the steps of winding electrode foils and polyethylene terephthalate tapes to form a wound capacitor coil in which the electrode foils project beyond the side edges of tapes, winding extra turns of overwrap polyethylene terephthalate about said coil, turning the projecting electrode foils back upon said wound capacitor, applying electrically conductive material on a ceramic wafer to form conductive paths thereon, heating the wafer to a temperature of from approximately 600 degrees F. to 800 degrees F., applying said coil and thereby the turned electrode foils to the conductive paths on the heated wafer to fuse said electrode foils to said conductive paths to form said electronic assembly and simultaneously fusing said overwrap to said wafer, and cooling said electronic assembly.

4. The method of assembling an electronic component in a ceramic wafer comprising the steps of winding electrode foils and polyethylene terephthalate tapes to form a wound capacitor coil, winding extra turns of overwrap polyethylene terephthalate about said coil to enclose the coil in a cover, heating the wafer to a temperature of approximately 700 degrees F., fusing the coil to said wafer by applying the covered coil against the heated wafer to form a fused connection between the wafer and said overwrap, and cooling the assembly so formed.

References Cited in the file of this patent

UNITED STATES PATENTS

| | | |
|---|---|---|
| 1,926,842 | Dubilier | Sept. 12, 1933 |
| 2,585,752 | Dorst | Feb. 12, 1952 |
| 2,673,949 | Khouri et al. | Mar. 30, 1954 |
| 2,704,880 | Brennan | Mar. 29, 1955 |
| 2,771,663 | Henry | Nov. 27, 1956 |
| 2,793,333 | Ehlers | May 31, 1957 |

FOREIGN PATENTS

| | | |
|---|---|---|
| 775,842 | Great Britain | May 29, 1957 |